(12) United States Patent  
Ikushima (10) Patent No.: US 10,086,573 B2
(45) Date of Patent: Oct. 2, 2018

(54) APPLICATION METHOD OF LIQUID MATERIAL, APPLICATION DEVICE AND PROGRAM

(75) Inventor: Kazumasa Ikushima, Mitaka (JP)

(73) Assignee: MUSASHI ENGINEERING, INC., Tokyo (JP)

( * ) Notice: Subject to any disclaimer, the term of this patent is extended or adjusted under 35 U.S.C. 154(b) by 678 days.

(21) Appl. No.: 13/978,801

(22) PCT Filed: Jan. 18, 2012

(86) PCT No.: PCT/JP2012/050912
§ 371 (c)(1),
(2), (4) Date: Aug. 9, 2013

(87) PCT Pub. No.: WO2012/099147
PCT Pub. Date: Jul. 26, 2012

(65) Prior Publication Data
US 2013/0313745 A1 Nov. 28, 2013

(30) Foreign Application Priority Data
Jan. 19, 2011 (JP) ................. 2011-008648

(51) Int. Cl.
| B29C 70/68 | (2006.01) |
| B05C 5/02 | (2006.01) |
| B05C 11/10 | (2006.01) |
| H01L 21/67 | (2006.01) |
| H01L 21/56 | (2006.01) |
| H01L 23/00 | (2006.01) |
| B05D 1/00 | (2006.01) |
| B05D 1/26 | (2006.01) |

(52) U.S. Cl.
CPC ............ B29C 70/68 (2013.01); B05C 5/0212 (2013.01); B05C 11/1034 (2013.01);
(Continued)

(58) Field of Classification Search
CPC .................................................. B05C 11/1034
See application file for complete search history.

(56) References Cited

U.S. PATENT DOCUMENTS 8,809,075 B2 * 8/2014 Ikushima .............. H01L 21/563
257/778
2004/0084549 A1 5/2004 Maruyama et al.
(Continued)

FOREIGN PATENT DOCUMENTS

CN 1426853 A 7/2003
EP 2 246 125 A1 11/2010
(Continued)

OTHER PUBLICATIONS

Chinese Office Action dated Jun. 5, 2014, issued in corresponding Chinese Patent Application No. 201280005913.X with partial English translation (8 pages).
(Continued)

*Primary Examiner* — Ryan M Ochylski
(74) *Attorney, Agent, or Firm* — Westerman, Hattori, Daniels & Adrian, LLP (57) ABSTRACT

A liquid material application method for filling, based on a capillary action, a liquid material ejected from an ejection device, the method includes a step of preparing a plurality of cycles and allocating the cycles to the application regions, the cycles each including one ejection pulse combined with a plurality of pause pulses at a predetermined ratio, a correction amount calculation step of measuring an ejection amount at timing of a correction period that is set in advance, and calculating a correction amount of the ejection amount, and a step of adjusting a ratio of the pause pulses to one ejection pulse for one or more cycles based on the correction amount calculated in the correction amount calculation step, wherein a length of the pause pulse is set to be sufficiently shorter than a length of the ejection pulse.

13 Claims, 7 Drawing Sheets

(52) U.S. Cl.
CPC ........ *H01L 21/563* (2013.01); *H01L 21/6715* (2013.01); *H01L 24/75* (2013.01); *H01L 24/83* (2013.01); *B05D 1/00* (2013.01); *B05D 1/26* (2013.01); *H01L 24/16* (2013.01); *H01L 24/29* (2013.01); *H01L 24/32* (2013.01); *H01L 2224/16238* (2013.01); *H01L 2224/2919* (2013.01); *H01L 2224/32225* (2013.01); *H01L 2224/73204* (2013.01); *H01L 2224/759* (2013.01); *H01L 2224/75611* (2013.01); *H01L 2224/75804* (2013.01); *H01L 2224/75901* (2013.01); *H01L 2224/8385* (2013.01); *H01L 2224/83102* (2013.01); *H01L 2224/92125* (2013.01); *H01L 2924/12042* (2013.01)

(56) References Cited

U.S. PATENT DOCUMENTS

| | | |
|---|---|---|
| 2005/0167519 A1 | 8/2005 | Holm et al. |
| 2008/0248193 A1 | 10/2008 | Nakatsuji et al. |
| 2010/0052198 A1 | 3/2010 | Ikushima |
| 2012/0156808 A1* | 6/2012 | Ikushima .............. H01L 21/563 438/5 |

FOREIGN PATENT DOCUMENTS

| | | |
|---|---|---|
| JP | 2004-344883 A | 12/2004 |
| JP | 2005-532906 A | 11/2005 |
| JP | 2006-021160 A | 1/2006 |
| JP | 2008-114129 A | 5/2008 |
| JP | 2009-190012 A | 8/2009 |
| WO | 2010/147052 A1 | 12/2010 |

OTHER PUBLICATIONS

International Search Report dated Apr. 17, 2012, issued in corresponding application No. PCT/JP2012/050912.
Supplementary European Search Report dated Jan. 21, 2016, issued in counterpart European application No. 12736584.9. (2 pages)

* cited by examiner

APPLICATION METHOD OF LIQUID MATERIAL, APPLICATION DEVICE AND PROGRAM

TECHNICAL FIELD

The present invention relates to a liquid material application method, an application device, and a program, which are adapted for filling, based on a capillary action, a liquid material ejected from an ejection device into a gap between a substrate and a workpiece placed on the substrate. More particularly, the present invention relates to a method, a device, and a program, which can correct change of an ejection amount and can stabilize the shape of the applied liquid material without changing a moving speed of the ejection device in an underfilling process during packaging of a semiconductor.

In this description, the term "ejection amount" implies an amount of the liquid material discharged from a nozzle with one ejection, and the term "application amount" implies an amount of the liquid material, which is required in a certain range (e.g., an application pattern or an application region) where a plurality of ejections are performed.

BACKGROUND ART

As one of mounting techniques for a semiconductor chip, there is a technique called a flip chip scheme. According to the flip chip scheme, protrusive electrodes (bumps) 31 are formed on the surface of a semiconductor chip 30, and the bumps 31 are directly connected to electrode pads 32 on a substrate 29.

Figure 7:
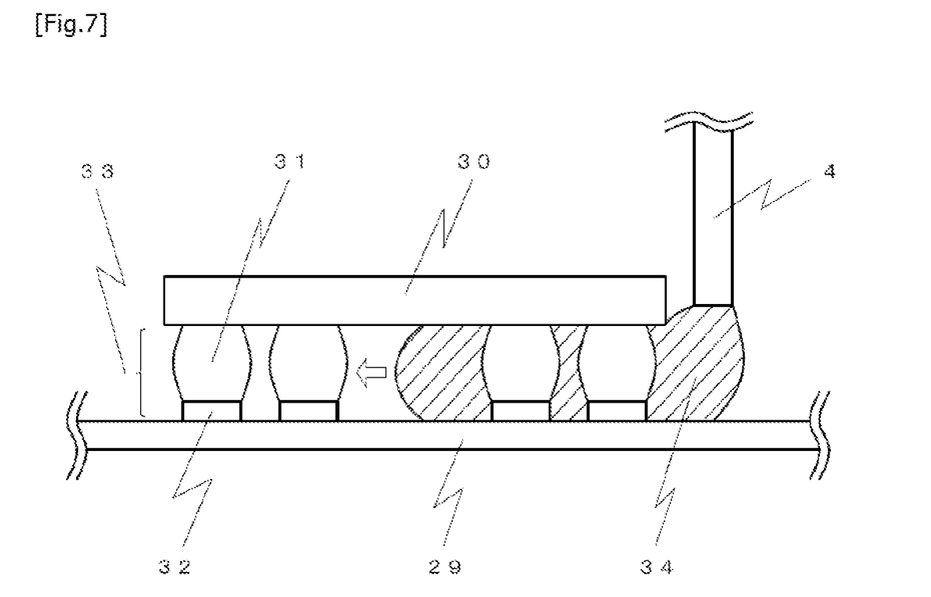
FIG. 7 is a side sectional view to explain an underfilling process.

In the flip chip packaging, a resin is filled into a gap between the semiconductor chip 30 and the substrate 29 for reinforcement of a connecting portion 33 in order to prevent that stress generated due to difference in thermal expansion coefficient between the semiconductor chip 30 and the substrate 29 concentrates on the connecting portion 33 and damages the connecting portion 33. Such a process is called "underfilling" (see FIG. 7).

The underfilling process is performed by applying a liquid resin 34 along an outer periphery of the semiconductor chip 30, filling the resin 34 into the gap between the semiconductor chip 30 and the substrate 29 based on a capillary action, and then heating and hardening the resin 34 in an oven, for example.

In the underfilling process, it is required to consider change in viscosity of a resin material with the lapse of time. This is because there is a problem that as viscosity increases, an amount of material ejected through a discharge port reduces and the capillary action is insufficient, whereby the material is not filled in a proper amount into the gap. In the case of the viscosity changing to a large extent, the ejection amount reduces 10% or more after 6 hours, for example. This results in the necessity of correcting the change of the ejection amount, which is caused by the viscosity change with the lapse of time.

In general, a dispenser is used to fill the resin material in the underfilling process. As one type of dispenser, there is a jet type dispenser for ejecting the liquid material in the form of jetted small droplets from a nozzle.

A method of performing the underfilling process using the jet type dispenser is disclosed in, for example, Japanese Patent Laid-Open Publication No. 2004-344883 (Patent Document 1). In more detail, Patent Document 1 discloses a method of ejecting a viscous material onto a substrate by employing the jet type dispenser, the method comprising the steps of previously confirming a total volume of the viscous material to be ejected and a length over which the viscous material in the total volume is ejected, performing an operation to apply a plurality of liquid droplets of the viscous material onto a weighing gauge, generating a feedback signal representing the weight of the plural liquid droplets of the viscous material having been applied onto the weighing gauge, and determining a maximum relative speed between the dispenser and the substrate such that the viscous material in the total volume is ejected over the aforesaid length.

The method disclosed in Patent Document 1 further comprises the steps of determining respective volumes of the plural droplets of the viscous material, determining a total number of liquid droplets, which is required to provide a volume of the viscous material substantially equal to the total volume, determining a distance between the liquid droplets, which is required to substantially uniformly distribute the liquid droplets of the viscous material over the aforesaid length, and determining a rate value at which the liquid droplets of the viscous material are ejected from the dispenser to eject the viscous material in the total volume over the aforesaid length at the maximum relative speed.

Moreover, when the underfilling is performed, a fillet portion 35 filled with the liquid resin 34 is formed at a corner defined by a lateral surface of the semiconductor chip 30 and the substrate 29. The fillet portion 35 is called a "fillet" (see FIG. 8). If the fillet 35 is non-uniformly formed, problems arise in that air may enter through a portion where the fillet 35 is small, thus causing entrapment of bubbles, that the resin 34 may extend to enter an application inhibited region around a chip 30 as an application target, and that a semiconductor chip 34 may be damaged in the heating and hardening step. For that reason, the fillet 35 is required to be uniformly formed with a constant width 36 and a constant height 37.

Figure 8:
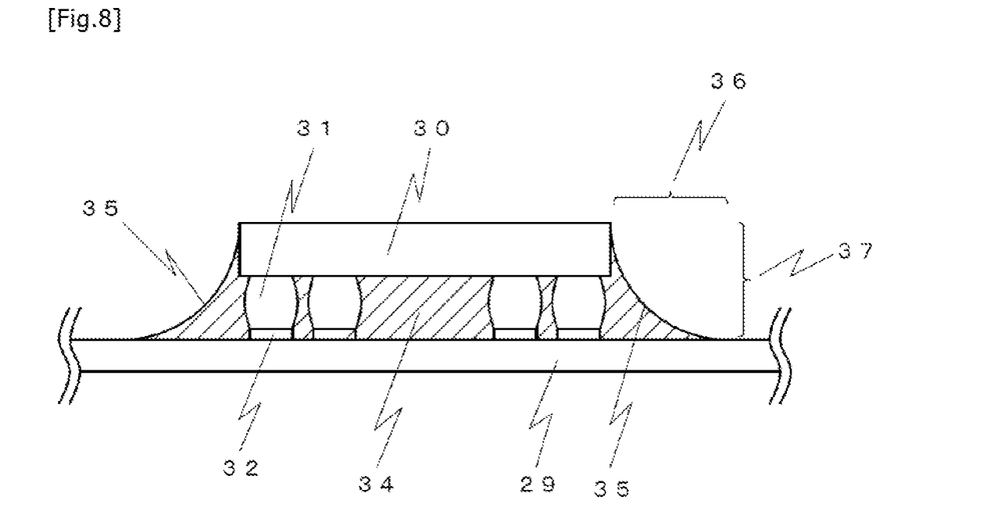
FIG. 8 is a side sectional view to explain a fillet.

One cause why the fillet 35 is non-uniformly formed resides in a difference in degree of penetration depending on density at which the bumps 31 are arranged. In general, the liquid resin 34 penetrates more quickly at a location where the bumps 31 are arranged at a higher density, and the liquid resin 34 penetrates more slowly at a location where the bumps 31 are arranged at a lower density. Therefore, when the liquid resin is applied in a constant amount, the fillet 35 being not uniform in the width 36 and the height 37 is formed depending on the above-mentioned difference in degree of penetration, and the shape of the fillet 35 becomes not uniform.

Another cause why the fillet 35 is non-uniformly formed resides in speed change during the application operation. When the application is performed along an L- or U-shaped locus that requires a moving direction of the dispenser to be changed, a moving speed has to be reduced at a corner (direction changing portion) for change of the direction. Furthermore, the moving speed has also to be reduced at the start and the end of movement of the dispenser. Such a speed reduction is unavoidable because the dispenser is a mechanical machine. Thus, when the liquid resin is applied in the constant amount, the application amount is increased at the corner, the start point, and the end point, whereby the shape of the fillet 35 becomes not uniform.

In addition, the following technique is known as another example of the technique for applying the liquid material in the underfilling process.

Patent Document 2 discloses an application method of preparing a desired application pattern, ejecting a liquid material from a nozzle while a nozzle and a workpiece are moved relative to each other, and applying the liquid material in a specified amount to the workpiece, the application method comprising a step of specifying, as a total pulse number, the number of times ejection pulses or pause pulses are transmitted, specifying the number of ejection pulses required to achieve the ejection amount, and specifying a remaining pulse number as the number of pause pulses; a step of measuring an amount of the liquid material ejected from the nozzle at timing of a preset correction period, and calculating a correction amount of the ejection amount; and a step of adjusting the number of ejection pulses and the number of pause pulses based on the calculated correction amount.

Patent Document 3 discloses a liquid material filling method for filling, based on a capillary action, a liquid material ejected from an ejection device into a gap between a substrate and a workpiece placed on the substrate, the method comprising the steps of preparing an application pattern made up of a plurality of continuous application regions, allocating a plurality of ejection cycles to the application regions, the cycles each including ejection pulses and pause pulses combined at a predetermined ratio between respective pulse numbers, measuring an amount of the liquid material ejected from the ejection device at timing of a preset correction period, and calculating a correction amount of the ejection amount, the method further comprising a step of adjusting the number of ejection pulses and the number of pause pulses, both included in the application pattern, based on the calculated correction amount, and/or a step of adjusting a length of at least one of the application regions and a length of one or two of the application regions, the latter one or two application regions being continuous to the former one application region, without changing the ejection amount in each of the application regions per unit time.

PATENT DOCUMENTS

Patent Document 1: Japanese Patent Laid-Open Publication No. 2004-344883
Patent Document 2: Japanese Patent Laid-Open Publication No. 2009-190012
Patent Document 3: International Publication Pamphlet No. WO2010/147052

SUMMARY OF THE INVENTION

Problems to be Solved by the Invention

Patent Document 1 has the problem that procedures for determining the number of droplets and the interval between the droplets are necessary to realize uniform ejection over the length, and various parameters are determined in those procedures through calculations, whereby many errors may be caused during the calculations. Another problem is that sizes of individual droplets have to be made even in order to realize the uniform ejection, and a special means is needed for that purpose.

Furthermore, in Patent Document 1, the maximum relative speed for uniformly ejecting the liquid material over the length is determined on the premise that the relative speed of the nozzle and the workpiece is made variable. However, change of the relative speed causes the problem that a processing time is also changed and a throughput per unit time cannot be kept constant. Moreover, the method of determining the maximum relative speed and uniformly distributing the droplets in one application pattern is difficult to perform the application in a way adaptable for different arrangements of bumps and the corners of a chip, thus causing a possibility that the fillet shape may become not uniform.

Patent Document 2 intends to control the application amount by combination of the ejection pulses and the pause pulses, but it has the problem that, when the correction is executed by changing a ratio between the number of ejection pulses and the number of pause pulses, the pulse type to be required at the end point of the application pattern is often mismatched with the pulse type allocated after the correction. For example, when the ejection pulse is to be set at the end point of the application pattern, a slight deviation occurs in the ejection amount if the pause pulse is set after the correction.

Patent Document 3 has not only a similar problem to that caused in Patent Document 2 by adjusting the pulse number, but also another problem caused by adjusting the length of the application region. In other words, when the length of the application region is changed, the shape of the applied liquid material is also changed. With such change of the conditions, the amount of the liquid material may become extra or short and the fillet cannot be uniformly formed in some cases.

An object of the present invention is to solve the above-mentioned problems and to provide an application method, an application device, and a program, which can correct change of an ejection amount with high accuracy and can stabilize a shape of an applied liquid material or a fillet shape.

Means for Solving the Problems

With the view of solving the above-mentioned problems, the inventor has accomplished the present invention by finding the fact that, in the application method using ejection pulses and pause pulses, there is correlation between a length of the pause pulse and accuracy in correction of the ejection amount.

More specifically, according to a first aspect of the present invention, there is provided a liquid material application method for filling, based on a capillary action, a liquid material ejected from an ejection device into a gap between a substrate and a workpiece placed on the substrate, the application method comprising a step of preparing an application pattern made up of a plurality of continuous application regions, a cycle allocation step of preparing a plurality of cycles and allocating the cycles to the application regions, the cycles each including one ejection pulse combined with a plurality of pause pulses at a predetermined ratio, an application step of performing application to the application regions with the cycles allocated respectively to the application regions, a correction amount calculation step of measuring an ejection amount from the ejection device at timing of a correction period that is set in advance, and calculating a correction amount of the ejection amount, and an ejection amount adjustment step of adjusting a ratio of the pause pulses to one ejection pulse for one or more cycles based on the correction amount calculated in the correction amount calculation step, wherein a length of the pause pulse is set to be sufficiently shorter than a length of the ejection pulse.

According to a second aspect of the present invention, in the liquid material application method according to the first aspect, the length of the pause pulse is not more than $\frac{1}{20}$ of the length of the ejection pulse.

According to a third aspect of the present invention, in the liquid material application method according to the first or second aspect, in the cycle allocation step, the ejection pulses having the same length and the pause pulses having the same length are allocated to the cycles.

According to a fourth aspect of the present invention, in the liquid material application method according to any one of the first to third aspects, in the ejection amount adjustment step, the respective lengths of the ejection pulse and the pause pulse are not changed.

According to a fifth aspect of the present invention, in the liquid material application method according to any one of the first to fourth aspects, in the ejection amount adjustment step, an overall length of the application pattern and a length of each application region are not changed.

According to a sixth aspect of the present invention, in the liquid material application method according to any one of the first to fifth aspects, in the ejection amount correction step, the ejection amount is corrected without changing a relative moving speed between the ejection device and the workpiece.

According to a seventh aspect of the present invention, in the liquid material application method according to any one of the first to sixth aspects, in a step prior to the correction amount calculation step, an allowable range is set for use in determining whether or not correction is to be performed, and the correction is performed when the allowable range is exceeded.

According to an eighth aspect of the present invention, in the liquid material application method according to any one of the first to seventh aspects, the correction period is set based on time information, the number of workpieces, or the number of substrates, which is input as the correction period by a user.

According to a ninth aspect of the present invention, in the liquid material application method according to any one of the first to eighth aspects, in the ejection amount adjustment step, the ratio of the pause pulses to one ejection pulse is adjusted for plural cycles.

According to a tenth aspect of the present invention, there is provided an application device comprising a liquid material supply unit for supplying a liquid material, an ejection device having an ejection port through which the liquid material is ejected, a measurement unit for measuring an amount of the liquid material ejected through the ejection port, a driving mechanism for moving the ejection port and a workpiece relative to each other; and a control unit for controlling operations of the aforesaid components, wherein the control unit executes the liquid material application method according to any one of the first to ninth aspects.

According to an eleventh aspect of the present invention, there is provided a program adapted for an application device comprising a liquid material supply unit for supplying a liquid material, an ejection device having an ejection port through which the liquid material is ejected, a measurement unit for measuring an amount of the liquid material ejected through the ejection port, a driving mechanism for moving the ejection port and a workpiece relative to each other, and a control unit for controlling operations of the aforesaid components, wherein the program causes the control unit to execute the liquid material application method according to any one of the first to ninth aspects.

Advantageous Effect of the Invention

With the present invention, since the relative moving speed (hereinafter also referred to simply as a "relative speed") between the ejection device and the workpiece is not changed, a processing time is not changed and production can be stably performed at a constant throughput. Moreover, since balance between penetration of the liquid material into the gap and supply of the liquid material from the ejection device is not changed, a fillet can be formed in a constant shape.

Furthermore, since plural cycles can be set in one application pattern and the number of pulses included in the cycle is adjusted when the correction is performed, instead of changing the relative speed or the pattern length, the ejection amount per ejection can be held constant even for a non-uniform application pattern. Stated in another way, the application can be performed in a way highly flexible when preparing the application pattern and adaptable for different arrangements of bumps and corners of a chip.

In addition, since the relative speed is not changed and a position at which the cycle is altered is not changed, the shape of the applied liquid material is also not changed, whereby the application can be performed even when an application inhibited region or a component other than an application target is present nearby.

Still further, since the adjustment is performed on the pause pulses with priority, the ejection pulses are less affected and stable ejection is realized.

EMBODIMENT FOR CARRYING OUT THE INVENTION

Figure 1:
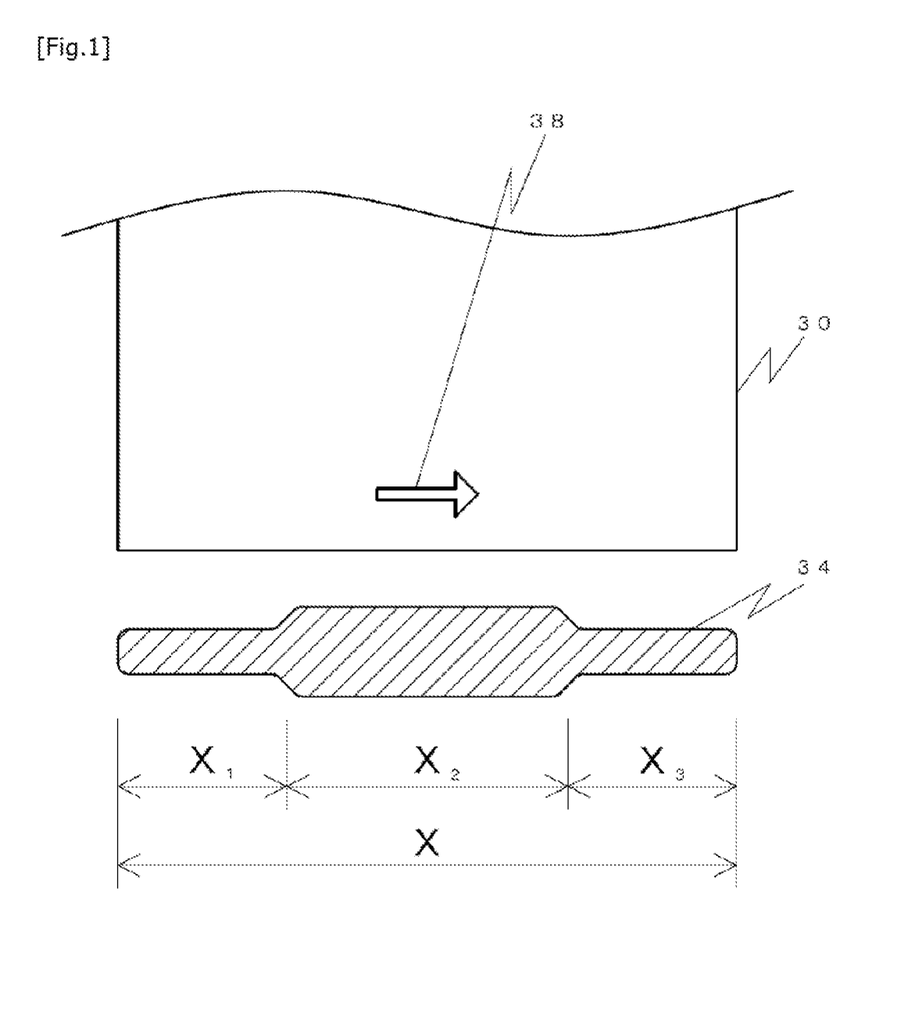
FIG. 1 is an explanatory view illustrating an example of an application pattern according to the present invention.
Figure 2:
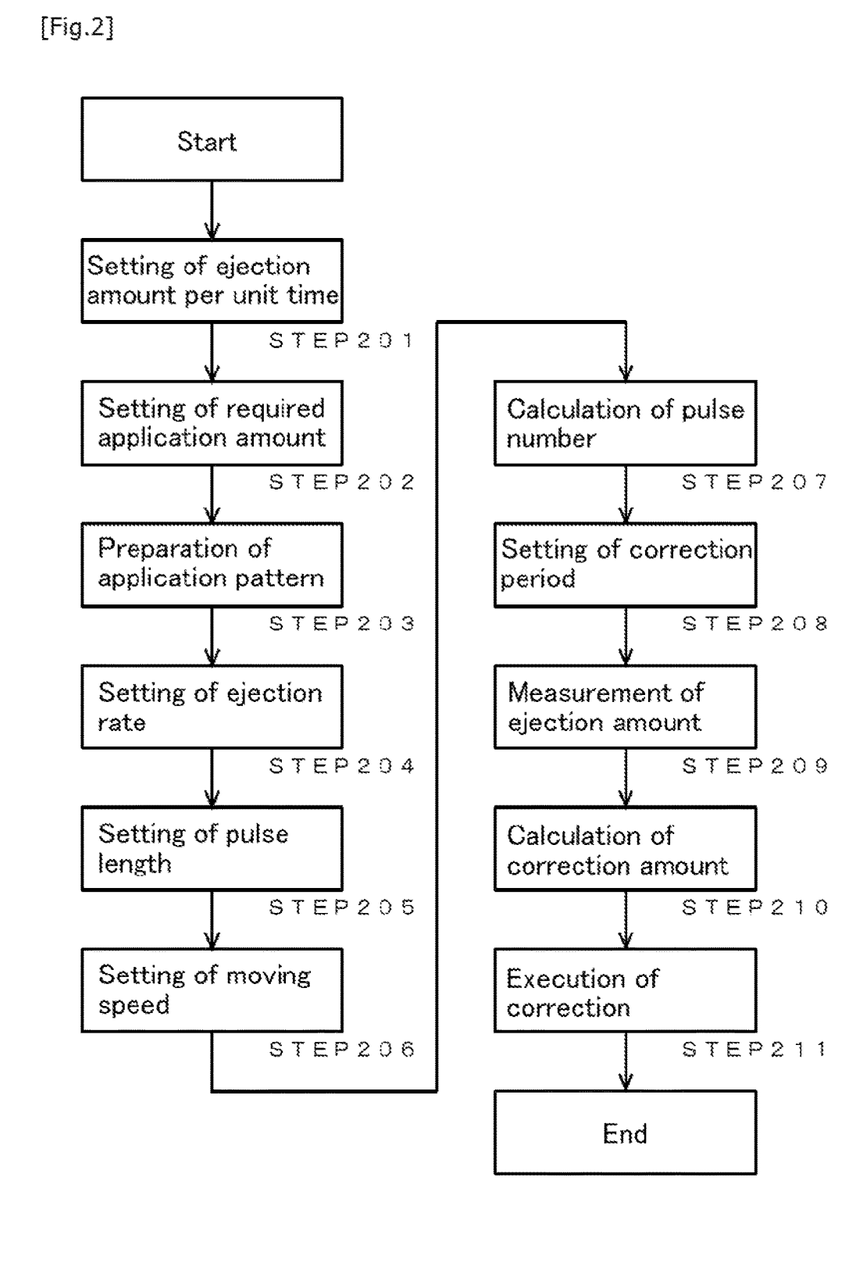
FIG. 2 is a flowchart illustrating procedures for adjusting an ejection amount of a liquid material according to the present invention.

One embodiment for carrying out the present invention will be described below with reference to FIGS. 1 and 2. FIG. 1 illustrates an example of an application pattern according to the embodiment, and FIG. 2 is a flowchart illustrating procedures for adjusting an ejection amount according to the embodiment. It is to be noted that, in FIG. 1, the chip 30 and the liquid material 34 are drawn with a slight space given between them for easier understanding of the explanation. In practical application of the liquid material, the liquid material is applied close to the chip without substantially leaving any space between them.

The ejection device used in the embodiment is of the jet type driving a valve member in response reception of a pulse signal and striking the valve member against a valve seat, thereby causing the liquid material to fly to be ejected from a nozzle (detailed structure being described later in Example). In that type of ejection device, one ejection is performed by receiving one pulse signal.

The present invention can be applied to any type of ejection device in which the liquid material is ejected in a state of a flying stream or droplets, and applicable ejection devices are not limited to the jet type.

[1] Setting of Ejection Amount Per Unit Time (STEP 201)

An amount of the liquid material ejected from the ejection device per unit time is determined. The ejection amount may be determined with an experiment in advance or may be measured before starting operation. Anyway, the measurement is preferably performed by ejecting the liquid material that is used in practice. The reason is that the ejection amount per unit time is different depending on characteristics (such as viscosity and density) of various liquid materials. When a plurality of ejection devices are prepared and used in turns, the ejection amount per unit time is preferably determined for each of the ejection devices because there are so-called individual differences among the ejection devices. That point similarly holds in the case where, for example, the type of the liquid material, a nozzle diameter, etc. are changed.

In addition, a variation (deviation) of the ejection amount in the same ejection device is determined. Such a variation may be taken into consideration in setting of STEP 204 described later.

[2] Setting of Required Application Amount (STEP 202)

An amount of the liquid material required to be applied to fill a gap between the substrate and the workpiece (semiconductor chip) and to form a fillet is determined. The required application amount may be determined as a theoretical value from design drawings, etc., or determined by actually applying the liquid material. However, because the theoretical value is an ideal value, the required application amount is preferably determined by actually applying the liquid material from the viewpoint of achieving high accuracy. Additionally, the required application amount may be determined in terms of either volume or mass. On that occasion, a density value of the liquid material used is necessary.

[3] Preparation of Application Pattern (STEP 203)

A side along which the application is to be performed is set in consideration of the arrangement of bumps used for connecting the workpiece and the substrate, the situations of other components around the workpiece, and so on. In a rectangular workpiece, for example, applying the liquid material linearly along one side or applying the liquid material in an L-like shape along two adjacent sides is set. Once the application pattern is specified, a total application length is determined. Here, the term "application length" implies a total length of relative movement of the nozzle and the workpiece when the application is performed on one workpiece.

Furthermore, in consideration of the arrangement of bumps and whether or not to pass the chip corner, and so on, a plurality of application regions where the ejection amount per unit time is different are set in one application pattern, and a length of each of the application regions is set. For example, as illustrated in FIG. 1, when the liquid material is linearly applied along one side of a workpiece 30 in a direction denoted by a symbol 38, application regions $X_1$ to $X_3$ are set and the application amount is set such that it is relatively large near a center of the one side of the workpiece (i.e., in the region $X_2$) and relatively small on both sides of the center (i.e., in the regions $X_1$ and $X_3$). In FIG. 1, for convenience of the explanation, the region where the application amount is relatively large is drawn by a thick line, and the region where the application amount is relatively small is drawn by a thin line. The large or small application amount is set by changing an ejection rate in STEP 204 described below.

[4] Setting of Ejection Rate (STEP 204)

To obtain the application amount set in above [3] which is different per application region, a proportion (ratio) at which the ejection pulses and the pause pulses are combined is set for each of the application regions ($X_1$ to $X_3$). More specifically, the ejection rate is set for all the application regions such that a proportion of the ejection pulses among all the pulses in one application region (hereinafter also referred to as an "ejection rate") becomes different per application region. In the embodiment, the ejection rate is 100% when the entire application region is made up of only the ejection pulses, and is 0% when the entire application region is made up of only the pause pulses. The ejection rate is constant in one application region.

The ejection rate can be set in the range of 100% to 0% Taking into account the variation determined in STEP 201 and a width of adjustment performed later, however, the ejection rate is preferably set to, e.g., 80% with an allowance on each of the upper and lower sides instead of being set to 100% even in the region (e.g., the region $X_2$ in FIG. 1) where the ejection amount is maximum in one application pattern. By so setting, the adjustment is made adaptable not only in a direction of increasing the ejection amount, but also in a direction of decreasing the ejection amount.

[5] Setting of Pulse Length (ON Time/OFF Time) (STEP 205)

Because the ejection device used in the embodiment is of the jet type, the valve member is operated through one reciprocating stroke upon receiving one ejection pulse, thereby performing one ejection. The pulse signal includes an ejection pulse having an ON time during which the valve member is apart from the valve seat and an OFF time during which the valve member is held contacted with the valve seat, and a pause pulse having only an OFF time while having no ON time, the pause pulse not taking part in the ejection operation. The ejection pulse and the pause pulse are each transmitted at a constant frequency (frequencies of the ejection pulse and the pause pulse are different from each other).

The ON time and the OFF time of the ejection pulse and the pause pulse are set per application region. However, there is a proper range for each of the ON time and the OFF time of the ejection pulse. If the proper range is not satisfied, there may arise a trouble (e.g., excessive adhesion of the liquid material to a nozzle end, scattering of a droplet of the applied liquid material into plural pieces, or no jetting of the liquid material). Although the proper range is different depending on characteristics of the liquid material, the ejection amount, and so on, it is preferable that the ON time is set in the range of 2 to 10 [msec] and the OFF time is set in the range of 2 to 10 [msec], for example. Most frequently, the ON time is set to 3 [msec] and the OFF time is set to 3 [msec]. In principle, the ON time and the OFF time are set to the same value. On the other hand, as a matter of course, the pause pulse is free from the above-mentioned time range.

The application pattern is constituted as a combination of plural cycles. Here, the term "cycle" implies a combination of one ejection pulse and pause pulses. As described above, cycles executed in the application regions are different from each other to provide different application amounts in the individual application regions. Thus, the ratio of one ejection pulse to pause pulses combined with each other is different for each application region. However, a pulse length (i.e., a pulse period; the sum of an ON time and an OFF time of the pulse) is not made different in the application regions. In other words, the pulse length is not changed in one application pattern. The pulse length is not required to be changed in the same ejection device once set, unless the type of liquid material is changed or the type of workpiece as the application target is changed.

In the present invention, the length of the pause pulses is set shorter than that of the ejection pulse. The former length is preferably not more than 1/20, more preferably not more than 1/100, and even more preferably not more than 1/1000 of the latter length. The reason resides in enabling finer adjustment to be performed, as described later, by setting shorter the length of the pause pulse of which number is increased and decreased with priority. When the length of the pause pulse is set to 1/100 of that of the ejection pulse, the ejection rate can be controlled up to order of 1%, and when the length of the pause pulse is set to 1/1000 of that of the ejection pulse, the ejection rate can be controlled up to order of 0.1%.

[6] Setting of Moving Speed (STEP 206)

A relative moving speed V between the ejection device and the workpiece can be set in two ways. According to one method, a target moving speed V is determined and set from a target volume of production, etc. Once application work or mass production of products is started, the moving speed is not basically changed during the work or the production. Hence the moving speed V may be freely determined. As a matter of course, although the moving speed V may be freely determined, there is a mechanically possible limit in the moving speed. Thus, the moving speed is determined within the mechanically possible limit.

According to the other method, the moving speed V is calculated from the above-mentioned setting values. Taking FIG. 1 as an example, on an assumption that the ejection amount per unit time is A [g/sec], the required application amount is $G_0$ [g], and the length of the application region is X [mm] the moving speed V [mm/sec] is expressed by the following formula.

$$V = \frac{A}{G_0} X \quad \text{[Math. 1]}$$

When any of the setting values in the right hand side of the formula (1) is changed, the moving speed V is calculated again each time the setting value is changed.

[7] Calculation of Pulse Numbers (STEP 207)

Respective numbers of ejection pulses and pause pulses in each application region are set based on the ejection rate in each application region, which has been set in STEP 204 described above. In the embodiment, a basic cycle is set by calculating the number of pause pulses with respect to one ejection pulse.

Figure 4:
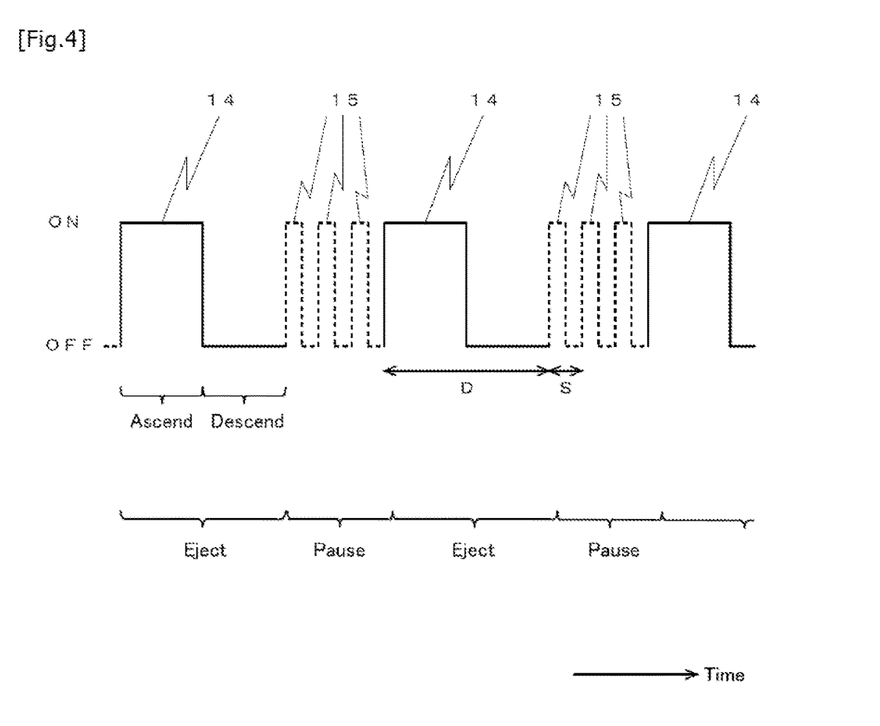
FIG. 4 is an explanatory view to explain pulse signals transmitted to the ejection device according to Example.

First, as schematically illustrated in FIG. 4, it is assumed that the length (i.e., the sum of the ON time and the OFF time) of one ejection pulse is D, the length (i.e., the sum of the hashed ON time and the hashed OFF time) of one pause pulse is S, the number of ejection pulses in each application region is $n_i$, and the number of pause pulses in each application region is $m_i$. As described above, since the ejection rate is defined as a proportion of the ejection pulses among the total pulse number in each application region, an ejection rate $C_i$ is expressed by the following formula.

$$C_i = \frac{D \cdot n_i}{D \cdot n_i + S \cdot m_i} \quad \text{[Math. 2]}$$

In the above formula, a suffix i denotes a number of the application region. In FIG. 1, for example, i is any one of 1, 2 and 3.

From the above formula, the number $m_i$ of pause pulses in each application region is expressed by the following formula.

$$m_i = \left(\frac{1}{C_i} - 1\right)\frac{D}{S} \cdot n_i \quad \text{[Math. 3]}$$

Thus, assuming the number of ejection pulses to be 1 (i.e., $n_i=1$), the number $m_i$ of pause pulses in each application region is expressed by the following formula.

$$m_i = \left(\frac{1}{C_i} - 1\right)\frac{D}{S} \quad \text{[Math. 4]}$$

Taking a practical example, when the ejection rate is set to 80% by setting the ON time of the ejection pulse to 3 [msec], the OFF time of the ejection pulse to 3 [msec], the ON time of the pause pulse to 0.005 [msec], and the OFF time of the ejection pulse to 0.005 [msec], the number m of pause pulses with respect to one ejection pulse is 150 from the formula [4]. When the ejection rate is set to 40% on condition that the length of the ejection pulse and the length of the pause pulse are the same, the number m of pause pulses with respect to one ejection pulse is 900. In that practical example, the calculated result is an exactly divided value (natural number). If the calculation result is not exactly divided, it is converted to a natural number, for example, by rounding a calculated value to the nearest whole number.

For each application region, the number of pause pulses with respect to one ejection pulse is calculated, and a basic cycle is set as a combination of the calculated number of pause pulses and one ejection pulse. In actual application work, the basic cycle is repeated until the time or the distance reaches a setting value, while the relative movement of the ejection device and the workpiece is continued in the application region. Taking FIG. 1 as an example, the ejection device starts the movement from the left end of the application region $X_1$, and performs the ejection by repeating a first basic cycle until reaching a connecting point between the application region $X_1$ and the application region $X_2$. Upon reaching the connecting point between the application region $X_1$ and the application region $X_2$, the first basic cycle is changed over to a second basic cycle without stopping the ejection device. Then, the ejection device performs the ejection by repeating the second basic cycle until reaching a connecting point between the application region $X_2$ and the application region $X_3$. Similarly, upon reaching the connecting point between the application region 2 and the application region 3, the second basic cycle is changed over to a third basic cycle, and the ejection is continued. Upon reaching the right end of the application region $X_3$, the ejection device is stopped and the application work is ended. Even when the number of application regions in the application pattern is increased or decreased, or when the application pattern includes a corner or the like, the ejection can be performed in a similar manner.

[8] Setting of Correction Period (STEP 208)

A correction period, i.e., a period at which the ejection amount is to be corrected, is set. The correction period is set as, e.g., time information, the number of chips or substrates, etc., which are input by a user. When a predetermined time is set as the correction period, a time from the start of the work is set at which change of the ejection amount of the liquid material is expected to exceed an allowable range. When the number of chips or substrates is set as the correction period, it is set by determining a time that is required to process one chip or one substrate (i.e., a time taken for carrying-in→application→carrying-out), and determining the number of processed chips or substrates from that time required per chip or substrate and the above-mentioned predetermined time.

When setting the correction period, it is preferable to calculate, e.g., the relationship between the application pattern and the application amount required for the application pattern with respect to the liquid material used in the application through tests in advance, and to reflect calculated values on the correction period. By setting the correction period in consideration of those parameters, change of the ejection amount is adaptively corrected even when there are influences caused by viscosity change of the liquid material attributable to change of temperature, clogging in an ejection portion, and water head difference.

Furthermore, a value calculated from the pot life specified by the maker may be stored in advance as a limit value of usage time of the liquid material, and it may be incorporated into the correction period.

When setting the correction period, the viscosity change of the liquid material caused with the lapse of time or depending on change of the temperature has to be taken into consideration. However, the following description is made on the premise that only the viscosity change occurs with the lapse of time.

As a matter of course, the known technique for controlling the viscosity of the liquid material with temperature adjustment in the ejection portion can also be applied to the present invention.

[9] Execution of Correction

A correction amount to be adapted for the change of the ejection amount, caused by the viscosity change of the liquid material, is calculated at the set correction period.

The correction amount can be calculated by (A) a method of measuring the weight of the liquid material ejected during a certain time, and calculating the correction amount based on a difference between the measured weight and the required weight, and (B) a method of measuring the ejection time necessary for reaching the required weight, and calculating the correction amount based on a difference between the measured ejection time and the ejection time in the just preceding period. While any of those methods can be employed in the present invention, practical procedures for calculating the correction amount in accordance with the method (A) will be described below.

(i) Measurement of Ejection Amount (STEP 209)

The nozzle (i.e., the ejection device) is moved to a position above a weighing gauge, and the liquid material is ejected at the fixed position. The ejection onto the weighing machine is continuously performed for a certain time. Such a certain time may be set to, for example, a time required to eject the liquid material over the application pattern that has been set as described above, or a time required for the experiment or the measurement carried out in STEP 201 described above.

Then, weight $G_1$ of the liquid material ejected onto the weighing gauge is read. A change rate R is calculated from the measured weight $G_1$ and the required weight $G_0$. The change rate R is expressed by the following formula.

$$R = \frac{G_1 - G_0}{G_0} \times 100 \qquad \text{[Math. 5]}$$

When the change rate R is minus, this means that the ejection amount in the certain ejection time is smaller than the required weight. Therefore, the correction amount is calculated in STEP 210, described below, so as to increase the ejection amount. Conversely, when the change rate R is plus, this means that the ejection amount in the certain ejection time is larger than the required weight. Therefore, the correction amount is calculated in STEP 210, described below, so as to decrease the ejection amount.

The weight measurement may be performed plural times to obtain an average value. By doing so, the measurement value can be obtained with higher accuracy.

(ii) Calculation of Correction Amount (New Pulse Number) (STEP 210)

The correction amount is calculated by determining a new ejection rate from the change rate described in above STEP 209, and calculating a new pulse number based on the calculation formula described in above STEP 207.

First, the new ejection rate is determined. As described above, when the change rate R is minus, the correction amount has to be calculated so as to increase the ejection amount. More specifically, assuming a new ejection rate in each region to be $C_i'$, it is expressed by the following formula.

$$C_i' = (1+R)C_i \qquad \text{[Math. 6]}$$

In the above formula, a suffix i denotes a number of the application region, and in FIG. 1, for example, i is any one of 1, 2 and 3 (this is equally applied to formulae mentioned below). On the other hand, when the change rate R is plus, the correction amount has to be calculated so as to decrease the ejection amount. Therefore, a new ejection rate in each region is expressed by the following formula.

$$C_i' = (1-R)C_i \qquad \text{[Math. 7]}$$

Then, the new pulse number is calculated for each application region based on both the new ejection rate in each region, which has been obtained from the above formula 6 or 7, and the formula 4 described in above STEP 207.

The following description is made in connection with a practical example. The same values as those in above STEP 207 are taken here as parameters. Assuming that, as a result of measuring the ejection amount after the lapse of a certain correction period, the new ejection rate $C_i'$ in a region where an initial setting ejection rate is 80% is smaller than the required ejection amount by 10% (i.e., the change rate R is minus 10%), it is 88% from the formula 6. Accordingly, the number of pause pulses with respect to one ejection pulse is 82 from the formula 4. Furthermore, the new ejection rate $C_i'$ in a region where the initial setting ejection rate is 40% is 44% from the formula 6. Accordingly, the number of pause pulses with respect to one ejection pulse is 764 from the formula 4. The new pulse numbers determined as described above are optionally combined to set new cycles for an application pattern.

Finer adjustment can be performed by increasing or decreasing the number of pause pulses with respect to one ejection pulse for each application region in such a manner.

(iii) Execution of Correction (STEP 211)

When it is determined in above STEP 209 that the correction of the ejection amount is required, the correction is executed by calculating new pulse numbers from the new ejection rate $C_i'$ in above STEP 210, and setting again the new pulse numbers for all the application regions of the application pattern.

The determination regarding whether or not to perform the correction of the ejection amount is preferably made in such a way of performing only when the difference of the measured ejection amount (measured value) or the change rate R exceeds an allowable range (e.g., ±5%), instead of always performing the correction when the weight difference or the change rate is not zero. A preferable embodiment of the correction in consideration of the allowable range is described in detail in Japanese Patent No. 3877038 granted to the present applicant. Thus, the allowable range is set for the determination regarding whether or not to perform the correction, and the correction is performed only when the difference value or the change rate exceeds the allowable range.

By executing the above-described STEP 209 to STEP 211 at the correction period set in STEP 208 or when the type (size or shape) of the substrate is changed, the optimum application amount can always be realized regardless of the viscosity change of the liquid material with the lapse of time.

According to the present invention described above, since the relative speed is not changed, the processing time is not changed, and production can be performed in a stable and constant manner. In addition, the balance between penetration of the liquid material into the above-mentioned gap and supply of the liquid material from the ejection device is not changed, whereby a constant fillet shape can be formed.

Furthermore, since plural cycles can be set in one application pattern and the correction is performed by adjusting the pulse number contained in the cycle without changing the relative speed and the pattern length, the ejection amount per ejection can be held constant even for the application pattern in which the application amount is not uniform. Stated in another way, flexibility is high in preparing the application pattern, and the application can be performed in a way adaptable for different arrangements of bumps and corners of a chip.

Moreover, since the relative speed is not changed and a position at which the cycle is altered (i.e., the length of each application region) is not changed, the shape of the applied liquid material is also not changed, whereby the application can be performed even when an application inhibited region or a component other than an application target is present nearby.

In addition, according to the present invention, the number of pause pulses is greatly varied with the correction, but a variation in the number of ejection pulses is small. Therefore, stable ejection is realized.

While details of the present invention will be described below in connection with Example, the present invention is in no way limited to the following Example.
[Example]
[Ejection Device]

Figure 3:
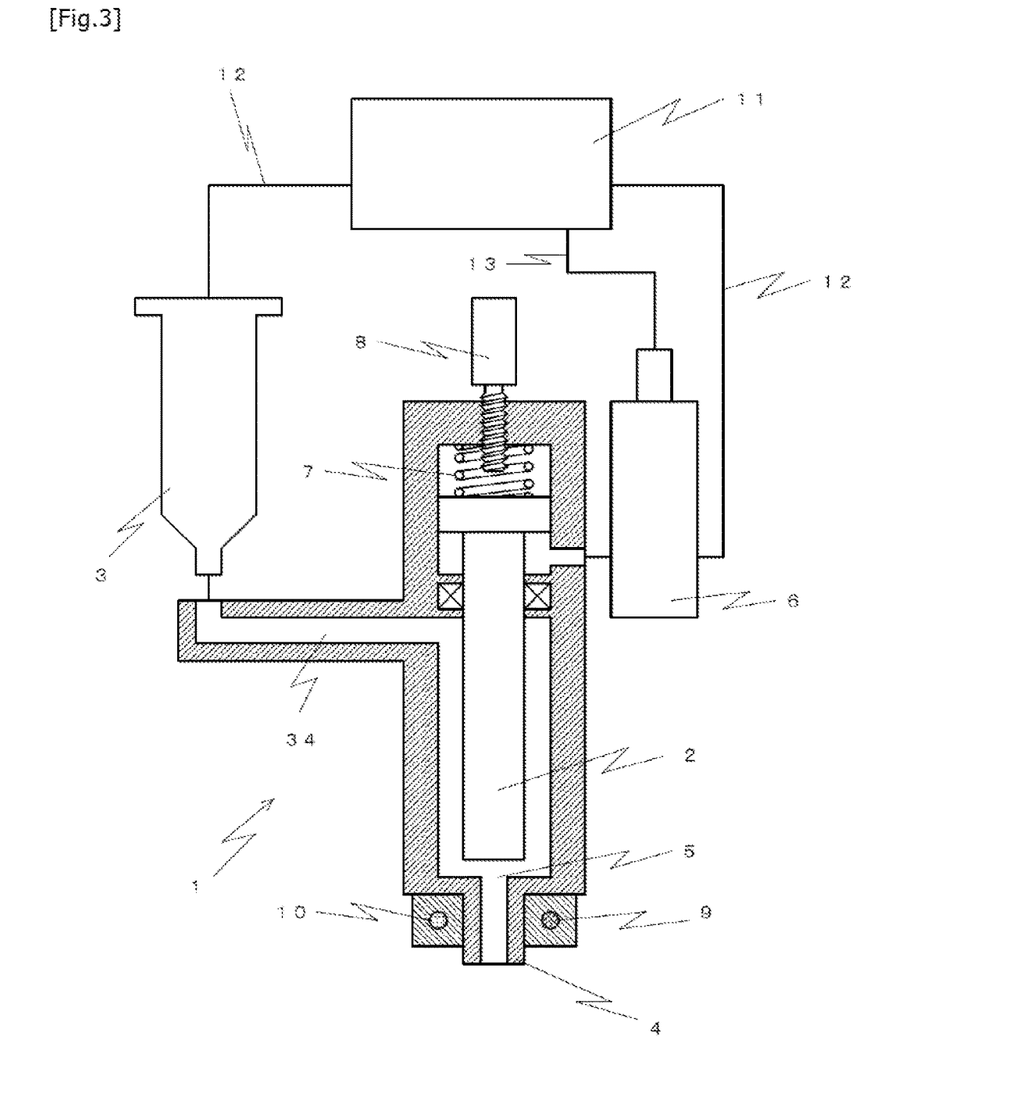
FIG. 3 is a sectional view of principal part of a jet type ejection device according to Example.

An ejection device 1 of Example is a jet type ejection device including, as illustrated in FIG. 3, a piston 2 disposed in the ejection device to be vertically movable and serving as a valve member, a reservoir 3 pressurized by compressed air having pressure that is regulated by a control unit 11, and a nozzle 4 communicating with the reservoir 3. The ejection device 1 further includes a selector valve 6 for supplying and exhausting working gas, which is used to move the piston 2 upwards, under control of the control unit 11, and a spring 7 for biasing the piston 2 downwards. Moreover, a stroke adjusting member 8 for adjusting an amount of movement of the piston 2 is disposed above the spring 7. A heater 9 for warming the nozzle 4 and a liquid material 34 present inside the nozzle 4 is disposed near the nozzle 4. In addition, a temperature sensor 10 is disposed near the nozzle 4 opposite to the heater 9 and is used to make control for holding the nozzle 4 and the liquid material 34 present inside the nozzle 4 at a predetermined temperature.

The liquid material 34 filled in the reservoir 3 is ejected from the nozzle 4 in the form of droplets by operating the selector valve 6 in accordance with a pulse signal transmitted from the control unit 11, thereby causing the piston 2 to move up and down. The liquid material 34 ejected from the nozzle 4 is applied in the form of dots to a substrate 29 that is properly positioned under the nozzle 4, while the ejection device 1 and the substrate 29 are moved relative to each other.

In more detail, the ejection device 1 operates as follows. The pulse signal supplied to the ejection device 1 is constituted, for example, as illustrated in FIG. 4. When the pulse signal is turned ON as denoted by a symbol 14, the gas is supplied with operation of the selector valve 6 to ascend the piston 2, thus opening a nozzle inlet 5. When the pulse signal is subsequently turned OFF, the gas is exhausted with operation of the selector valve 6 to descend the piston 2 by a resilient force of the spring 7, thus closing the nozzle inlet 5. Thus, one ejection pulse 14 operates in units of pulse signal having an ON state to ascend the piston 2 (i.e., to open the nozzle inlet 5) and an OFF state to descend the piston 2 (i.e., to close the nozzle inlet 5), and one droplet of the liquid material 34 is ejected with the operation in one unit. In FIG. 4, D represents a length of the ejection pulse 14. On the other hand, when the OFF state of the pulse signal is continued as denoted by a symbol 15, the piston 2 is not operated and the nozzle inlet 5 is closed during one unit (i.e., a time unit 5) with one pause pulse 15. In FIG. 4, represents a length of the pause pulse 15.

When the application is performed along a side of a workpiece 30, the control unit 11 transmits the preset pulse signals (denoted by the symbols 14 and 15) to the ejection device 1 while the nozzle 4 is moved at the same time as start of the application, thereby continuously ejecting the liquid material 34. The liquid material 34 ejected along one side of the workpiece 30 is successively filled into the gap between the workpiece 30 and the substrate 29 based on a capillary action.

[Application Device]

Figure 5:
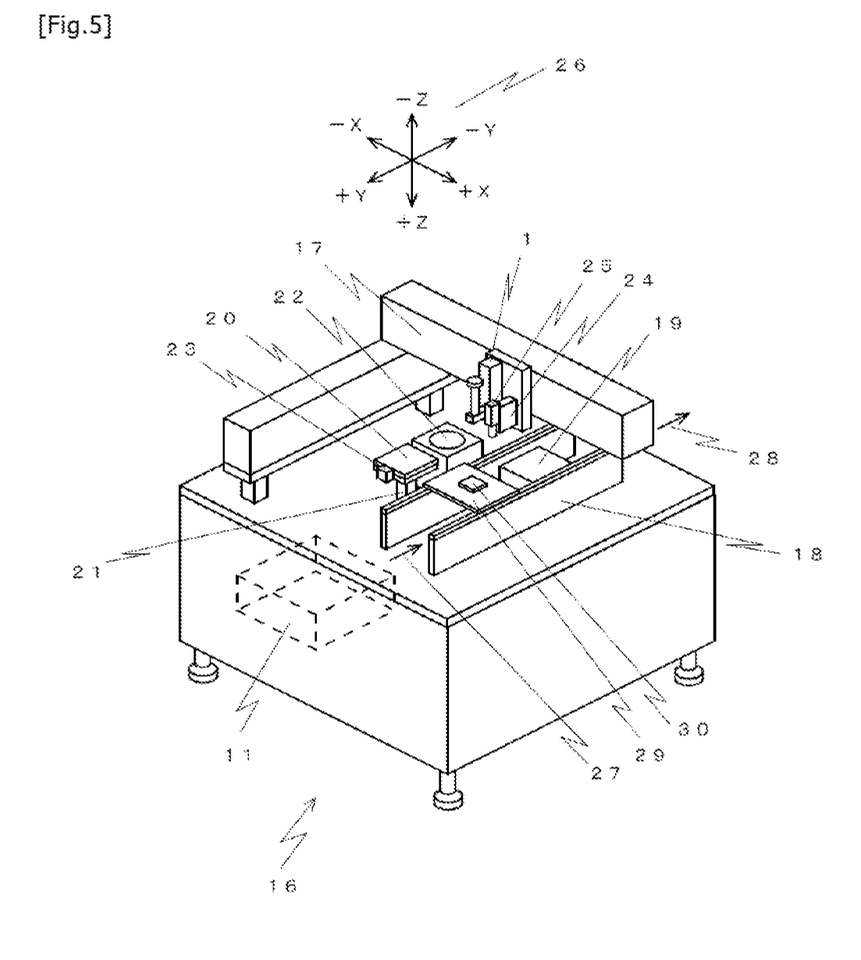
FIG. 5 is a schematic perspective view of an application device according to Example.

As illustrated in FIG. 5, the application device 16 of this Example includes the ejection device 1, an XYZ driving mechanism 17, a conveying mechanism 18, an application stage 19, a substrate 20 for adjustment, an adjustment stage 21 on which the substrate 20 is placed, a weighing gauge 22, a detection device (including a touch sensor 23, a laser displacement gauge 24, and a camera 25), and the control unit 11.

The ejection device 1 is the above-described jet type ejection device, which receives pulse signals (denoted by the symbols 14 and 15) from the control unit 11 and ejects the liquid material 34.

The ejection device 1, the laser displacement gauge 24, and the camera 25, the latter two constituting part of the later-described detection device, are mounted on the XYZ driving mechanism 17 such that the ejection device 1, the laser displacement gauge 24, and the camera 25 can be moved in XYZ directions denoted by a symbol 26. Stated in another way, in accordance with the application pattern set in the control unit 11, it is possible to move the ejection device 1 above the substrate, or to move the ejection device 1, the laser displacement gauge 24, and the camera 25 to a unit, e.g., the weighing gauge 22 or the touch sensor 23 as part of the later-described detection device, which is fixed at a separate position, or to the adjustment stage 21 on which the later-described substrate 20 for adjustment is placed.

The conveying mechanism 18 carries in the substrate 29, on which the workpiece 30 before being subjected to the application work is placed, from the outside of the application device in a direction denoted by a symbol 27, and further conveys the substrate 29 to a position near the ejection device 1 that performs the application work. In addition, the conveying mechanism 18 carries out the substrate 29, which has finished the application work, to the outside of the application device in a direction denoted by a symbol 28.

The application stage 19 is mounted substantially at a center of the conveying mechanism 18 between two rails of the conveying mechanism 18. When the application work is performed, the application stage 19 is ascended to fix the substrate 29 in place. When the substrate 29 is conveyed, the application stage 19 is descended to be out of interference with the conveyance of the substrate 29.

The adjustment stage 21 is disposed near the conveying mechanism 18. A bare substrate, i.e., a substrate including no parts mounted thereon, or a substrate including a dummy workpiece mounted thereon (those substrates being collectively referred to as the "substrate 20 for adjustment") is placed on the adjustment stage 21, and operations related to work for adjusting the ejection amount of the liquid material 34 are performed on the substrate 20 for adjustment.

The weighing gauge 22 measures the weight of the liquid material 34 ejected from the ejection device 1, and it is disposed near the conveying mechanism 18. The result measured by the weighing gauge 22 is transmitted to the control unit 11.

The detection device includes the touch sensor 23, i.e., a sensor for detecting the height position of the nozzle 4, the laser displacement gauge 24, i.e., a sensor for detecting the height position of the substrate 29, and the camera 25 for detecting the position of the workpiece 30. The laser displacement gauge 24 and the camera 25 are mounted to the XYZ driving mechanism 17 together with the ejection device 1 to be movable in the XYZ directions (denoted by the symbol 26). The touch sensor 23 is fixed to the adjustment stage 21.

The control unit 11 includes an overall control unit for controlling overall operations of the application device 16, and an ejection control unit for controlling operation of the ejection device 1.

[Application Work]

Figure 6:
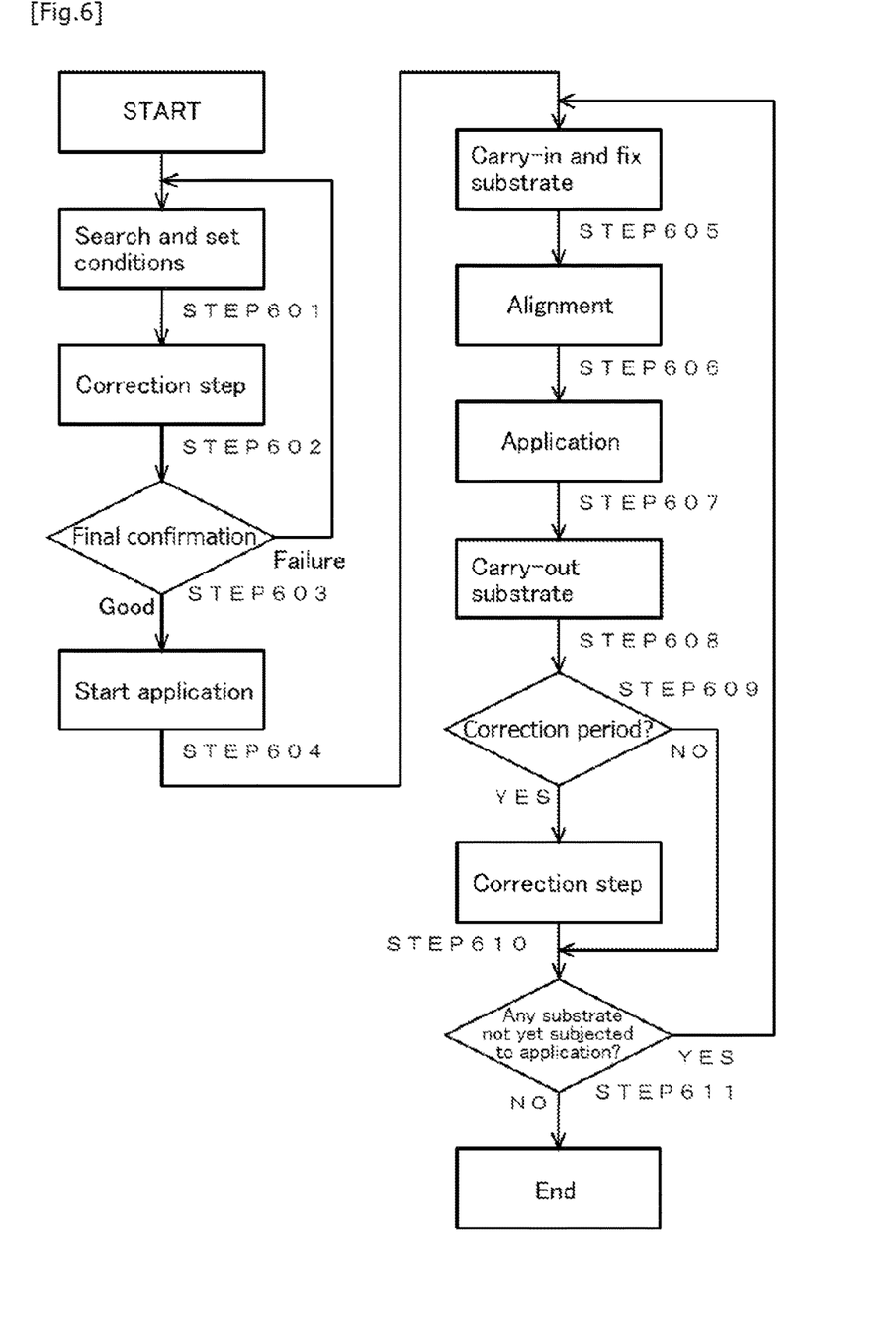
FIG. 6 is a flowchart illustrating procedures of application work in the application device according to Example.

A series of application work flow using the above-described application device 16 will be described below. FIG. 6 is a flowchart of the application work flow.

Conditions for performing stable ejection are searched and set by adjusting not only the above-described pulse-related parameters (ON/OFF times and the combination ratio thereof), but also ejection-amount modifying factors (such as the nozzle diameter, the stroke distance, and the applied pressure) of the ejection device 1 (STEP 601). That work is preferably performed while measuring the weight and the diameter of droplets resulting from actually applying the liquid material 34. Furthermore, at that time, it is preferable to additionally confirm whether the liquid material 34 is not excessively attached to the fore end of the nozzle 4, and whether the droplet resulting from applying the liquid material is not scattered in the form divided into plural pieces.

Next, an ejection amount correction process, which has been described in the above embodiment (see STEP 209 to 211), is executed (STEP 602). The effect of the ejection amount correction process can be obtained by executing it not only at timing of the correction period, but also in a preparation stage. Prior to starting main application after the end of the correction process, final confirmation is made by performing test application using a bare substrate or a dummy substrate (STEP 603). The test application is preferably performed using a substrate on which actual parts, etc. are mounted. If there is a failure as a result of the final confirmation, the conditions in STEP 601 are rechecked. If there is no failure, main application work is started (STEP 604).

Upon the start of the main application work, the substrate 29 is first carried in, conveyed to near the ejection device 1, and then fixed to the application stage 19 (STEP 605). Then, positioning of the substrate 29 on the application stage 19 is made by performing image confirmation of the substrate 29 using the camera 25, and executing an alignment operation (STEP 606). An image used as a reference in the alignment operation is stored in the control unit 11 in advance. After the positioning, application of the liquid material is started (STEP 607). After the application, the substrate 29 is carried out to the outside of the application device 16 (STEP 608).

At a time when the substrate 29 after the application is carried out to the outside of the application device 16, it is determined whether or not the preset correction period (e.g., the number of workpieces or the number of substrates) is reached (STEP 609). If the correction period is reached, the control flow goes to a next correction step. If the correction period is not yet reached, the control flow goes to STEP 611.

In the correction step, the ejection device 1 is moved to a position above the weighing gauge 22, and the liquid material is ejected to measure the weight of the ejected liquid material. If the measured result exceeds the allowable range, the ejection amount correction process, which has been described in the above embodiment (see STEP 209 to 211), is executed (STEP 610). On the other hand, if the measured result does not exceed the allowable range, the control flow goes to STEP 611.

After the end of the correction step or immediately after carrying out the substrate 29, it is determined whether or not there remains the substrate 29, which is not yet subjected to the application and on which the application is to be performed subsequently (STEP 611). If there remains the substrate 29 that is not yet subjected to the application, the control flow returns to STEP 605, following which the substrate 29 is carried in and the application work is performed again. If there is no substrate 29 that is not yet subjected to the application, the main application work is ended.

The foregoing is a series of basic flow from the preparation stage to the main application work. It is to be noted that such a series of basic flow has been described by way of example, and the present invention is not limited to the above-described procedures. Thus, control procedures can be variously modified within the scope of the technical idea of the present invention.

[Calculation Formulae Related to Pulse Number Calculation]

In the above-described embodiment, the number of pause pulses with respect to one ejection pulse is calculated, and such a combination of those pulses is set as the basic cycle for each application region. In this Example, however, the application is performed by calculating the number of ejection pulses and the number of pause pulses so as to realize the desired ejection rate over the length of the application region. Details are as follows.

First, it is assumed that the length (i.e., the sum of the ON time and the OFF time) of one ejection pulse is D, the length (i.e., the sum of the hashed ON time and the hashed OFF time) of one pause pulse is S, the number of ejection pulses in each application region is $n_j$, and the number of pause pulses in each application region is $m_i$. It is further assumed that the relative moving speed between the ejection device and the workpiece is V, the ejection rate in each application region is $C_i$, and the length of each application region is $X_i$. Here, a suffix i denotes a number of the application region. In FIG. 1, for example, i is any one of 1, 2 and 3.

On the basis of time, the ejection rate is represented by a proportion of a part, occupied by the ejection pulses, in a time required for the ejection device to pass through some application region, and the following formula is held.

$$\frac{X_i}{V} \cdot C_i = D \cdot n_i \qquad \text{[Math. 8]}$$

From the above formula, the number $n_i$ of ejection pulses in each application region can be calculated as follows.

$$n_i = \frac{X_i/V}{D} \cdot C_i \qquad \text{[Math. 9]}$$

On the other hand, in the time required for the ejection device to pass through some application region, a part not occupied by the ejection pulses represents a proportion of the remaining part occupied by the pause pulses, and the following formula is held.

$$\frac{X_i}{V} \cdot (1 - C_i) = S \cdot m_i \qquad \text{[Math. 10]}$$

From the above formula, the number $m_i$ of pause pulses in each application region can be calculated as follows.

$$m_i = \frac{X_i/V}{S} \cdot (1 - C_i) \qquad \text{[Math. 11]}$$

The number of ejection pulses and the number of pause pulses in each application region are calculated using the above formulae 9 and 11. The calculated pulse numbers are set for the application pattern.

The following description is made in connection with a practical example. Considering the case where the application pattern is the same as that illustrated in FIG. 1, it is assumed that the length D of one ejection pulse is 6 [msec], the length S of one pause pulse is 0.01 [msec], the moving speed V is 50 [mm/s], the length of each of the application regions $X_1$ and $X_3$ is 5 [mm], the ejection rate in each of the regions $X_1$ and $X_3$ is 40%, the length of the application region $X_2$ is 10 [mm], and the ejection rate in the application region $X_2$ is 80%.

The number of ejection pulses in each of the application regions $X_1$ and $X_3$ is 7 from the formula 9, and the number of pause pulses in each of the application regions $X_1$ and $X_3$ is 6000 from the formula 11. On the other hand, the number of ejection pulses in the application region $X_2$ is 27 from the formula 9, and the number of pause pulses in the application region $X_2$ is 4000 from the formula 11.

The pulse numbers thus obtained are allocated over the length of the application region, thereby setting the application pattern.

INDUSTRIAL APPLICABILITY

The present invention can be employed to apply the liquid material using an ejection device of the type in which the ejected liquid material departs away from a nozzle before contacting with an application target. Such an ejection device may be of, e.g., the jet type in which a valve member is collided against a valve seat, thus causing the liquid material to fly to be ejected from the fore end of the nozzle, the plunger jet type in which a plunger in the plunger type device is moved and then abruptly stopped, thus similarly causing the liquid material to fly to be ejected from the fore end of the nozzle, or the ink jet type operated in a continuous ejection mode or a on-demand mode.

It is needless to say that the present invention can be employed in an underfilling process during packaging of a semiconductor.

LIST OF REFERENCE SYMBOLS

1: ejection device 2: piston 3: reservoir 4: nozzle 5: nozzle inlet 6: selector valve 7: spring 8: stroke adjusting means 9: heater 10: temperature sensor 11: control unit 12: gas line 13: electric line 14: ejection pulse 15: pause pulse 16: application device 17: XYZ driving mechanism 18: conveying mechanism 19: application stage 20: substrate for adjustment 21: adjustment stage 22: weighing gauge 23: touch sensor 24: laser displacement gauge 25: camera 26: moving direction 27: carrying-in direction 28: carrying-out direction 29: substrate 30: workpiece (semiconductor chip) 31: protrusive electrodes (bumps) 32: electrode pad 33: connecting portion 34: resin, liquid material 35: fillet portion, fillet 36: fillet width 37: fillet height 38: application direction

The invention claimed is:

1. A liquid material application method for filling, based on capillary action, a liquid material ejected from an ejection device into a gap between a substrate and a workpiece placed on the substrate, the application method comprising:
a step of preparing an application pattern made up of a plurality of continuous application regions;
a cycle allocation step of preparing a plurality of cycles and allocating the cycles to the application regions, the cycles each including one ejection pulse combined with a plurality of pause pulses at a predetermined ratio;
an application step of performing application to the application regions with the cycles allocated respectively to the application regions;
a correction amount calculation step of measuring an ejection amount from the ejection device at timing of a correction period that is set in advance, and calculating a correction amount of the ejection amount and an appropriate number of pause pulses with respect to one ejection pulse; and
an ejection amount adjustment step of adjusting a ratio of the pause pulses to one ejection pulse for one or more cycles based on the appropriate number of pause pulses with respect to one ejection pulse calculated in the correction amount calculation step,
wherein the ejection pulse consists of ON time and OFF time,
wherein the pause pulse consists of OFF time, and
wherein a length of the pause pulse is not more than 1/20 of the length of the ejection pulse.

2. The liquid material application method according to claim 1, wherein, in the cycle allocation step, the ejection pulses having the same length and the pause pulses having the same length are allocated to the cycles.

3. The liquid material application method according to claim 1, wherein, in the ejection amount adjustment step, the respective lengths of the ejection pulse and the pause pulse are not changed.

4. The liquid material application method according to claim 1, wherein, in the ejection amount adjustment step, an overall length of the application pattern and a length of each application region are not changed.

5. The liquid material application method according to claim 1, wherein, in the ejection amount adjustment step, the ejection amount is corrected without changing a relative moving speed between the ejection device and the workpiece.

6. The liquid material application method according to claim 1, wherein, in a step prior to the correction amount calculation step, an allowable range is set for use in determining whether or not correction is to be performed, and the correction is performed when the allowable range is exceeded.

7. The liquid material application method according to claim 1, wherein the correction period is set based on time information, the number of workpieces, or the number of substrates, which is input as the correction period by a user.

8. The liquid material application method according to claim 1, wherein, in the ejection amount adjustment step, the ratio of the pause pulses to one ejection pulse is adjusted for plural cycles.

9. An application device comprising a liquid material supply unit for supplying a liquid material, an ejection device having an ejection port through which the liquid material is ejected, a measurement unit for measuring an amount of the liquid material ejected through the ejection port, a driving mechanism for moving the ejection port and a workpiece relative to each other, and a control unit for controlling operations of the aforesaid components, wherein the control unit executes the liquid material application method according to claim 1.

10. A computer program product embedded in a computer-readable storage medium adapted for an application device comprising a liquid material supply unit for supplying a liquid material, an ejection device having an ejection port through which the liquid material is ejected, a measurement unit for measuring an amount of the liquid material ejected through the ejection port, a driving mechanism for moving the ejection port and a workpiece relative to each other, and a control unit for controlling operations of the aforesaid components, wherein the program causes the control unit to execute the liquid material application method according to claim 1.

11. The liquid material application method according to claim 1, wherein the length of the pause pulse is not more than 1/100 of the length of the ejection pulse.

12. The liquid material application method according to claim 1, wherein the length of the pause pulse is not more than 1/1000 of the length of the ejection pulse.

13. The liquid material application method according to claim 1, wherein the ON time of the ejection pulse is set in the range of 2 to 10 msec and the OFF time of the ejection pulse is set in the range of 2 to 10 msec.

* * * * *